United States Patent
Lai (10) Patent No.: US 7,046,725 B2
(45) Date of Patent: May 16, 2006

(54) METHOD OF ADJUSTING WEIGHTS OF AN EQUALIZER

(75) Inventor: Jyh-Ting Lai, Hsinchu (TW)

(73) Assignee: Faraday Technology Corp., Hsin-Chu (TW)

( * ) Notice: Subject to any disclaimer, the term of this patent is extended or adjusted under 35 U.S.C. 154(b) by 742 days.

(21) Appl. No.: 10/165,391

(22) Filed: Jun. 7, 2002

(65) Prior Publication Data

US 2003/0043899 A1 Mar. 6, 2003

(51) Int. Cl.
*H03H 7/30* (2006.01)
*H03K 5/159* (2006.01)

(52) U.S. Cl. .................................................... 375/232

(58) Field of Classification Search ................ 375/229, 375/230, 231, 232, 233, 234, 235
See application file for complete search history.

(56) References Cited

U.S. PATENT DOCUMENTS

| 6,505,222 B1* | 1/2003 | Davis et al. ................. 708/323 |
| 2001/0048717 A1* | 12/2001 | Ougi et al. .................. 375/231 |
| 2004/0156461 A1* | 8/2004 | Agazzi et al. ............... 375/350 |
| 2005/0141441 A1* | 6/2005 | Tkachov et al. ............ 370/286 |

* cited by examiner

*Primary Examiner*—Kevin Burd
*Assistant Examiner*—Freshteh N Aghdam
(74) *Attorney, Agent, or Firm*—Winston Hsu (57) ABSTRACT

A method of adjusting the weights of a blind equalizer. In the blind equalizer, an error signal e(n) is reset to zero as soon as the error signal e(n) reaches a predetermined value such as a maximum error signal value so that the weight vector W(n+1) is unaffected by the error signal e(n). Furthermore, the error signal e(n) is also reset to zero as soon as a second slicer output $r_2(n)$ changes from the original value due to an adjustment or transmission error and results in an inaccuracy of error signal e(n) so that the weight vector W(n+1) is unaffected by the error signal e(n).

3 Claims, 6 Drawing Sheets

METHOD OF ADJUSTING WEIGHTS OF AN EQUALIZER

BACKGROUND OF THE INVENTION

1. Field of Invention

The present invention relates to a method of adjusting a blind equalizer. More particularly, the present invention relates to a method of adjusting weights of a blind equalizer.

2. Description of Related Art

Many modern digital data communications systems employ adaptive equalization to compensate for the effects of changing conditions and disturbances on the signal transmission channel. Equalization removes intersymbol interference (ISI) caused by transmission limited channel bandwidth. ISI causes the value of a given symbol to be distorted by the values of proceeding and following symbols. The equalization function is typically performed by digital receiver circuits.

An adaptive equalizer is essentially an adaptive digital filter. In systems using an adaptive equalizer, it is necessary to provide a method of adapting the filter response so as to adequately compensate for channel distortions. Several algorithms are available for adapting the filter coefficients and thereby the filter response. For example, one widely used method employs the Least Mean Squares (LMS) algorithm. In this algorithm, by varying the coefficient values as a function of an error signal (E), the equalizer output signal is forced to approximately equal a reference data sequence. This error signal is formed by subtracting the equalizer output signal from the reference data sequence. As the error signal approaches zero, the equalizer approaches convergence to make the equalizer output signal and the reference data sequence being almost equal.

When the equalizer operation is initiated, the coefficient values (filter weights) are usually not set at values to achieve adequate compensation of channel distortions. In order to force initial convergence of the equalizer coefficients, a known "training" signal may be used as the reference signal. This signal is programmed at both the transmitter and receiver. The error signal is formed at the receiver by subtracting a locally generated copy of the training signal from the output of the adaptive equalizer. The training signal serves to open the initially "eye" of the received signal, as known in the art. After adaptation with the training signal, the eye has opened considerably and the equalizer is switched to a decision-directed operating mode. In this mode final convergence of the filter tap weights is achieved by using the actual values of symbols from the output of the equalizer instead of using the training signal. The decision-directed equalizing mode is capable of tracking and canceling time varying channel distortions more rapidly than methods using periodically transmitted training signals.

A problem arises when a training signal is not available. In such case "blind" equalization is often used to provide initial convergence of the equalizer coefficient values and to force the eye of the communication system to open. Blind equalization has been extensively studied for a long time.

The adaptation of the weights in adaptive equalizers is based on an assumed correct decision about which symbol was received. This assumption is valid for equalizers with a training sequence for which the received symbol is in fact known in advance. Equalizers, however, are also used without the benefit of a training sequence, in which case the decision is not necessarily correct. These equalizers are referred to as blind equalizers. The term blind refers to trying to find the correct equalizer coefficients without a reference training sequence, therefore during convergence the decisions may be incorrect and the coefficients (weights) erroneously updated. Although the possibility of a mistake exists, if the blind equalizer makes correct decisions for a sufficiently large set of received symbols, the equalizer will converge correctly.

Unfortunately, if the Least Mean Squares (LMS) algorithm is introduced to adjust the weights of a conventional equalizer. As the level of the error signal (E) increases, the degree of adjustment for W(n+1) increases correspondingly. If an original level of an input signal is very close to a slicer level of a slicer of the equalizer, it is easy to occur that the level of the input signal is incorrectly introduced to change the level of the error signal (E). In such case, the final level of the error signal (E) is inaccurate and the adjusted weights of the equalizer are also incorrect.

SUMMARY OF THE INVENTION

Accordingly, one object of the present invention is to provide a method of adjusting weights of a blind equalizer such that an error signal e(n) is reset to zero as soon as the error signal e(n) reaches a predetermined value such as a maximum error signal value so that the weight vector W(n+1) is unaffected by the error signal e(n). Furthermore, the error signal e(n) is also reset to zero as soon as a slicer output changes from the original value due to an adjustment or transmission error and results in an inaccuracy of error signal e(n) so that the weight vector W(n+1) is unaffected by the error signal e(n).

To achieve these and other advantages and in accordance with the purpose of the invention, as embodied and broadly described herein, the invention provides a method of adjusting weights of a blind equalizer, the blind equalizer has a previous weight vector. The data is sequentially fed into the blind equalizer and jointed with previous data to form a data vector. The equalizer output is the inner product of the data vector and the previous weight vector. An error signal is generated by subtracting the filter output from the resulting slicer output. If the absolute value of the error signal is larger than the maximum error signal value, setting W(n+1)=W(n). If the absolute value of the error signal is not larger than the maximum error signal value, setting W(n+1)=W(n)+u×e(n)×X(n). The W(n) is the previous weight vector of the blind equalizer. The W(n+1) is a weight vector after the previous weight vector of the blind equalizer has gone through a unit time interval. The u is a fixed learning constant. The e(n) is the error signal. The X(n) is the data vector.

To achieve these and other advantages and in accordance with the purpose of the invention, as embodied and broadly described herein, the invention provides a method of adjusting weights of a blind equalizer. The blind equalizer has a previous weight vector. A datum is fed into the blind equalizer and jointed with previous data to form a first data vector. A first filter output is generated in response to the first data vector and the previous weight vector, and then fed into a slicer. A first resulting slicer output is generated in accordance with the first filter output and slice levels of the slicer. A second data vector is generated after a unit time interval when the second data vector are formed by feeding a new datum to the blind equalizer. A second filter output is generated in response to the second data vector and the previous weight vector, and then fed into the slicer. A second resulting slicer output is generated in accordance with the second filter output and the second data vector. An error signal is generated by subtracting the second filter output from the second resulting slicer output. If the first resulting slicer output and the second resulting slicer output are not met a signal transmitting requirement, setting W(n+1)=W(n). If the first resulting slicer output and the second resulting slicer output are met the signal transmitting requirement, setting W(n+1)=W(n)+u×e(n)×X(n). The W(n) is the previous weight vector of the blind equalizer. The W(n+1) is a weight vector after the previous weight vector of the blind equalizer has gone through a unit time interval. The u is a fixed learning constant. The e(n) is the error signal. The X(n) is the data vector.

To achieve these and other advantages and in accordance with the purpose of the invention, as embodied and broadly described herein, the invention provides a method of adjusting the weights of a blind equalizer. A maximum error signal value is provided. A first data vector is fed into the blind equalizer. A first filter output is generated in response to the first data vector and a previous weight vector of the blind equalizer and then fed into a slicer. A first resulting slicer output is generated in accordance with the first filter output and slice levels of the slicer. A second data vector is fed into the blind equalizer after a unit time interval when the first data vector is fed into the blind equalizer. A second filter output is generated in response to the second data vector and the previous weight vector, and then fed into the slicer. An error signal is generated by subtracting the first filter output from a second resulting slicer output. If the first resulting slicer output and the second resulting slicer output are not met requirements of signals for transmitting, setting W(n+1)=W(n). If the first resulting slicer output and the second resulting slicer output are met the requirements of signals for transmitting, it is determined if the absolute value of the error signal e(n) is larger than the maximum error signal value, if yes, setting W(n+1)=W(n), if no, setting W(n+1)=W(n)+u×e(n)×X(n). The $\overline{W}$(n) is the previous weight vector of the blind equalizer. The W(n+1) is a weight vector after the previous vector of the blind equalizer has gone through a unit time interval. The u is a fixed learning constant. The e(n) is the error signal. The X(n) is the data vector.

In this invention, the weights of a blind equalizer are adjusted to modify the error signal to zero so that the resulting weight vector of the blind equalizer is also changed. Hence, the desired weight vector for the blind equalizer is obtained.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 1:
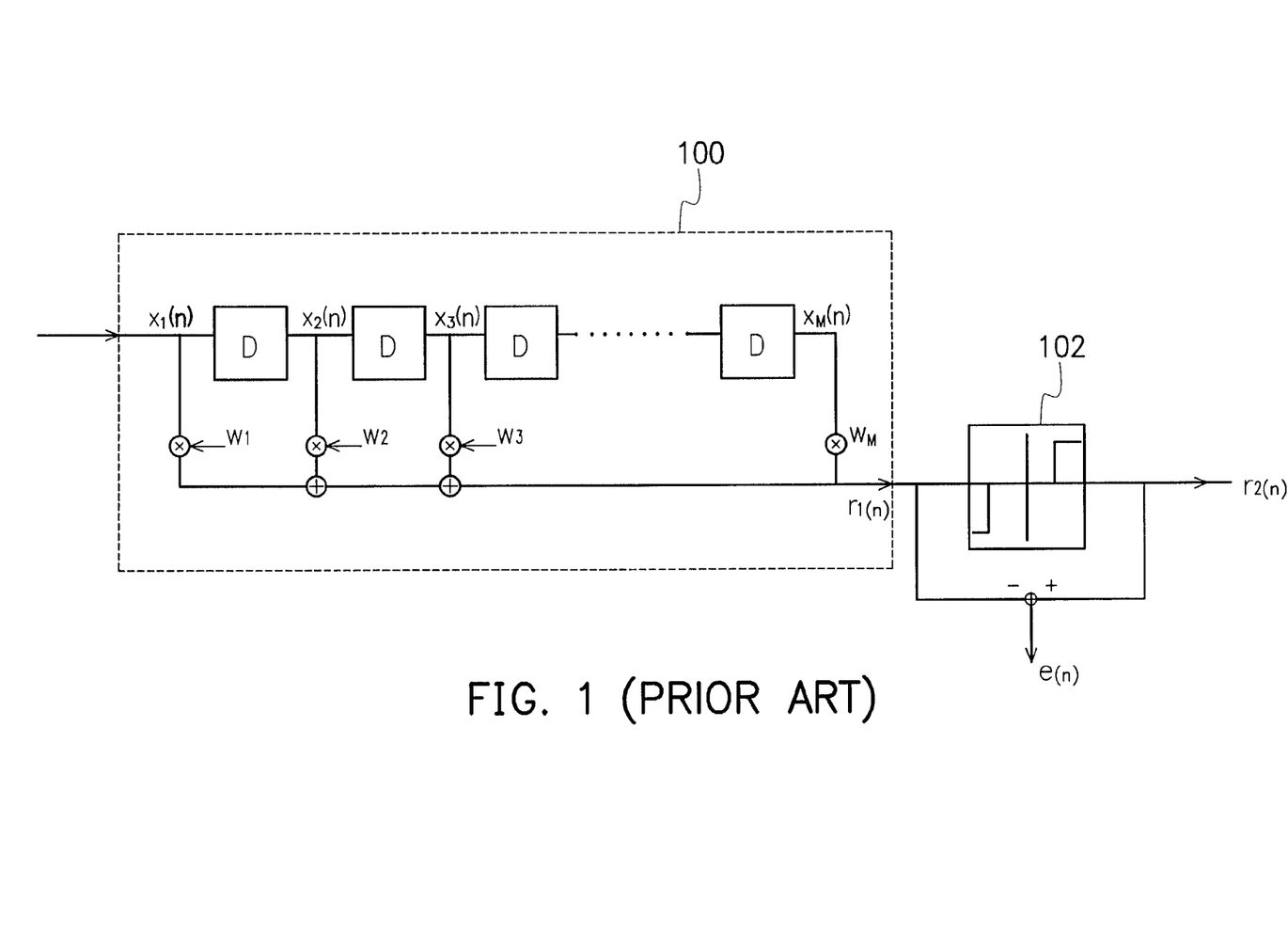
FIG. 1 is a sketch of an equalizer.

Referring to FIG. 1, is a sketch of a blind equalizer. As shown in FIG. 1, a blind equalizer generally incorporates a transversal finite impulse response (FIR) filter 100 and a slicer 102. When a series of consecutive data $x_1(n)$, $x_2(n)$, ..., $x_M(n)$ are fed into the equalizer 100, each piece of data performs a multiplication with a corresponding value of each of the weight-setting devices $w_1, w_2, \ldots, w_M$. The series of consecutive data are regarded as a data vector X(n) and the series of weights of the equalizer 100 are regarded as a weight vector W(n). In other words, the two vectors are performed an inner product operation to produce a filtered value $r_1(n)$ from the finite impulse response filter 102, where $r_1(n)=x_1(n)\times w_1+x_2(n)\times w_2+\ldots+x_M(n)\times w_M=X(n)TW(n)$. T is a matrix transition.

Figure 2A:
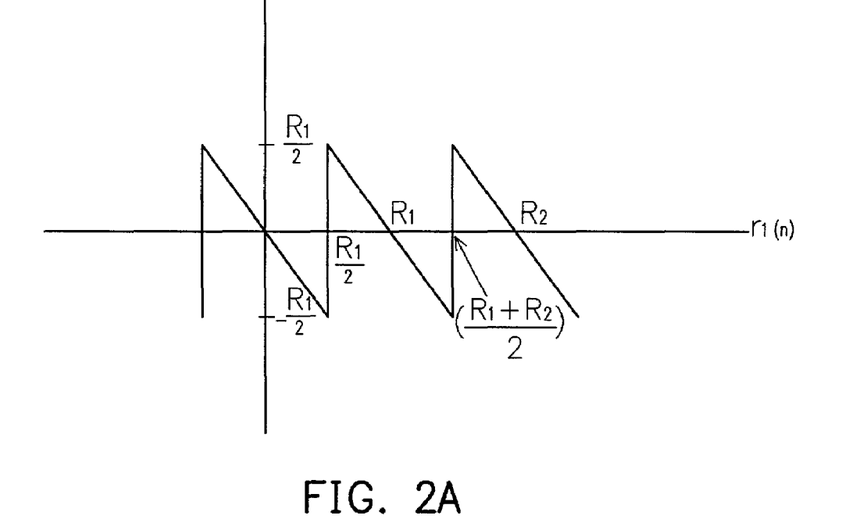
FIG. 2A is a diagram showing the input and output relationship of a conventional slicer.
Figure 2B:
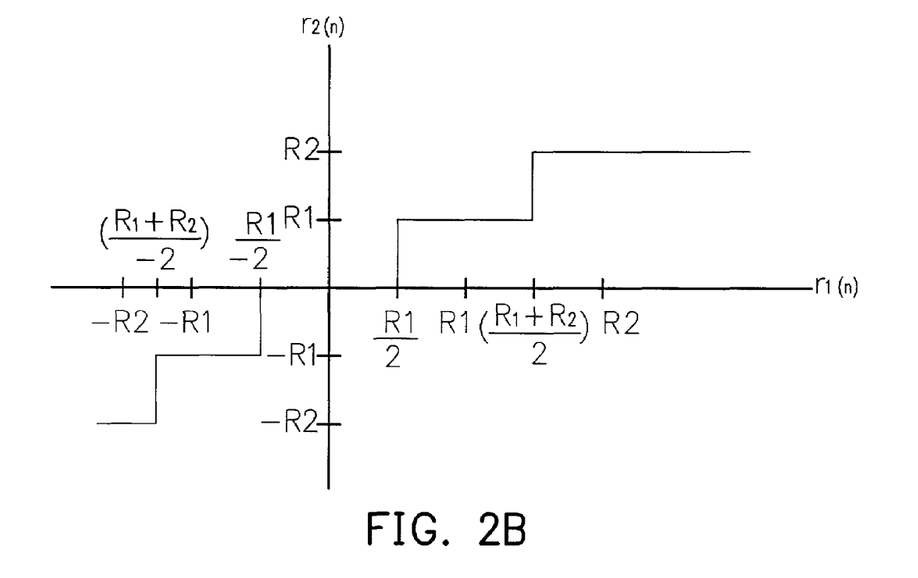
FIG. 2B is a diagram showing the slicer output of a slicer according to one preferred embodiment of this invention.

FIG. 2A is a diagram showing a relationship between an error signal e(n) by a conventional least-mean-square method and a filter output $r_1(n)$ from the filter 100 shown in FIG. 1. FIG. 2B is a diagram showing a relationship between the filter output $r_1(n)$ from the filter 100 and a slicer output $r_2(n)$ output from the slicer 102. When the filter output $r_1(n)$ is sent from the equalizer 100 to the slicer 102, the slicer 102 outputs the slicer output $r_2(n)$ according to the input filter output $r_1(n)$. The error signal e(n) is $r_2(n)-r_1(n)$. For example, if $R_1/2 \leq r_1(n) \leq (R_1+R_2)/2$, $r_2(n)=R_1$. If $(R_1+R_2)/2 < r_1(n) \leq (R_2+R_3)/2$, $r_2(n)=R_2$.

To obtain the best results between a transmitter and a receiver in a communication system, the values inside the series of weight-setting devices inside the blind equalizer 100 must be continuously adjusted. Consequently, a least average error algorithm is used to adjust the weight values of various weight-setting devices.

The Least Mean Squares (LMS) algorithm is as followed:

$$W(n+1)=W(n)+u\times e(n)\times X(n);$$

$$\text{where } W(n+1) = \begin{bmatrix} w_1(n+1) \\ w_2(n+1) \\ \vdots \\ w_M(n+1) \end{bmatrix}$$

is a vector after a previous weight vector of the equalizer being gone through a unit time interval, $$W(n) = \begin{bmatrix} w_1(n) \\ w_2(n) \\ \vdots \\ w_M(n) \end{bmatrix}$$

is the previous weight vector of the equalizer, $$X(n) = \begin{bmatrix} x_1(n) \\ x_2(n) \\ \vdots \\ x_M(n) \end{bmatrix}$$

is a data vector, u is a fixed constant, and e(n) is an error signal.

The Least Mean Squares (LMS) algorithm is introduced to adjust weights of an equalizer. However, as the error signal e(n) increases, the degree of adjustment for W(n+1) increases correspondingly. Furthermore, if the filter output $r_1(n)$ is at the middle of a first slicer level ($R_1$) and a second slice level ($R_2$), the ideal slicer output is $R_1$. However, these is noise in the channel, the slicer output $r_2(n)$ will change from $R_1$ to $R_2$ due to this small noise. Hence, the final error signal e(n) is inaccurate and the required values of the weight-setting devices are very imprecise.

A series of data jointed together to form a data vector (for example, x1(n), x$_2$(n), ..., x$_M$(n) as a data vector X(n)) are fed to an equalizer (100 in FIG. 1). An matrix multiplication of the data vector and the original weight vector (w$_1$, w$_2$, ..., w$_M$) of the blind equalizer 100 is carried out to produce a filter output $r_1(n)$ (for example: $r_1(n) = x_1(n) \times w_1 + x_2(n) \times w_2 + \ldots + x_M(n) \times w_M$). Thereafter, the filter output $r_1(n)$ is fed to a slicer (102 in FIG. 1). After comparing the filter output $r_1(n)$ with slice levels of the slicer 102, the slicer 102 outputs a resulting slicer output $r_2(n)$.

Figure 3:
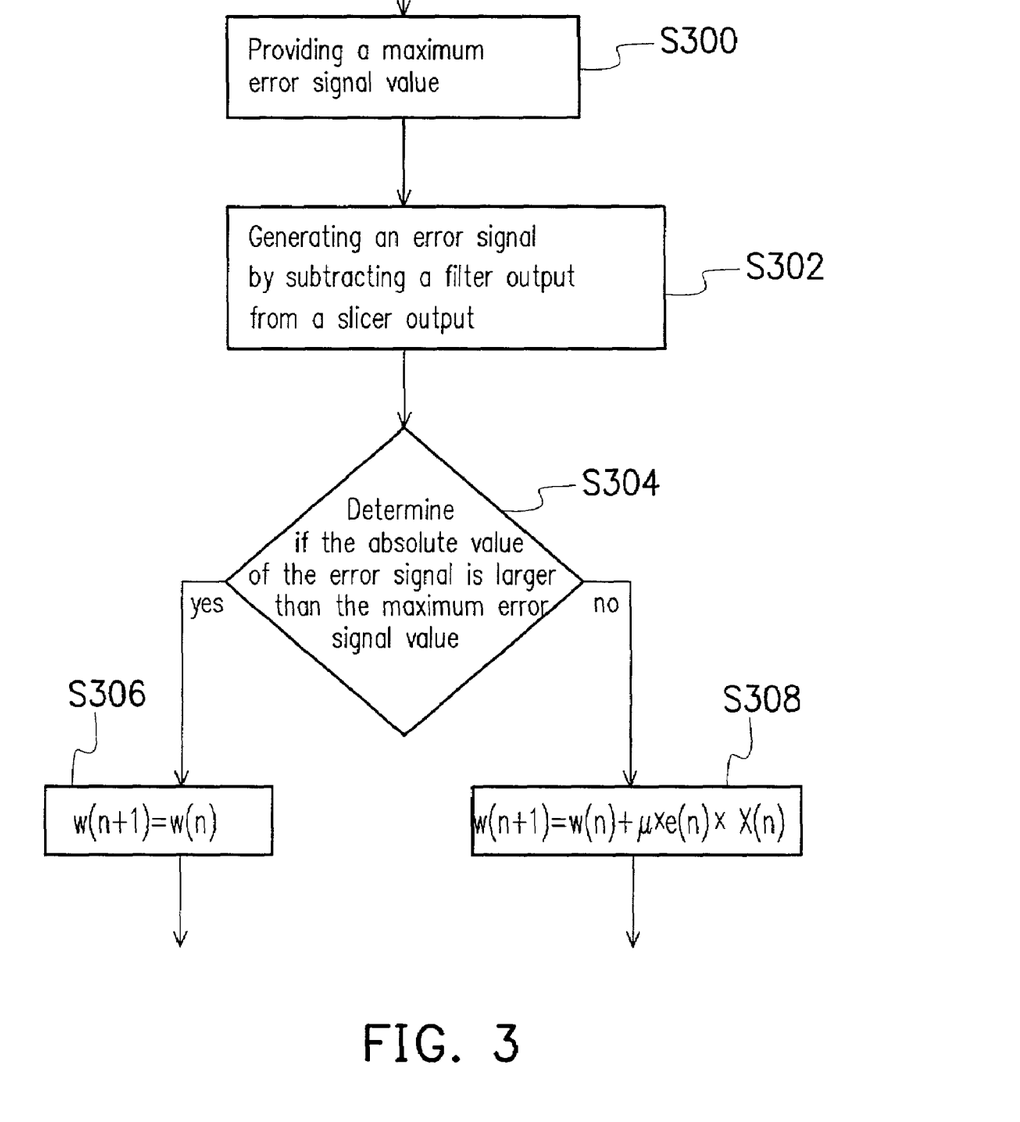
FIG. 3 is a flow diagram showing a first method of adjusting the weights of a blind equalizer according to one preferred embodiment of this invention.
Figure 4:
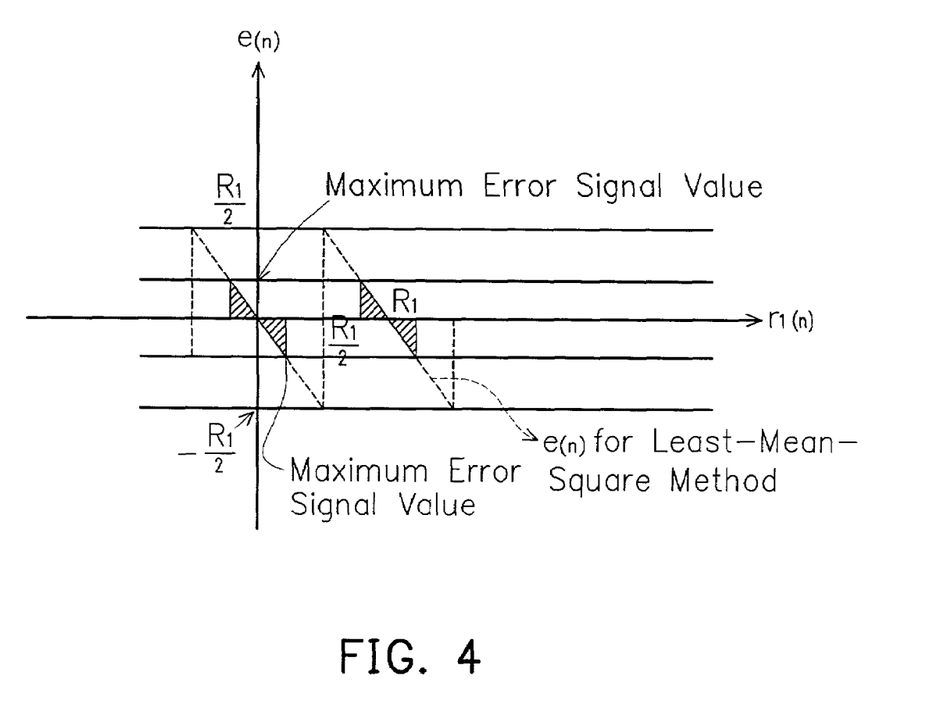
FIG. 4 is a diagram showing the output signal from a slicer according to the preferred embodiment of this invention.

Refer to FIG. 3 and FIG. 4, FIG. 3 is a flow diagram showing a first method of adjusting weights of a blind equalizer according to one preferred embodiment of this invention. FIG. 4 a relationship between an error signal e(n) by a least-mean-square method and a filter output of $r_1(n)$ from the filter according to one preferred embodiment of this invention. First, step S300, a maximum error signal value is provided to the slicer 102. Secondly, as stated in S302, an error signal (e(n)=$r_2$(n)−$r_1$(n)) is produced by subtracting a filter output $r_1(n)$ from a resulting slicer output $r_2(n)$.

Next, step S304 is executed to determine if the absolute value of the error signal e(n) is larger than the maximum error signal value. If the absolute value of the error signal e(n) is larger than the maximum error signal value, as stated in step S306, an error signal e(n) in the least-mean-square method W(n+1)=W(n)+u×e(n)×X(n) is equal to zero, that is, e(n)=0 and W(n+1)=W(n).

Otherwise, if the absolute value of the error signal e(n) is not larger than the maximum error signal value, as stated in step S308, the least-mean-square method W(n+1)=W(n)+u×e(n)×X(n) is executed. Note that the W(n+1) is the weight vector obtained after a previous weight vector of the blind equalizer has gone through a unit time interval, W(n) is the previous weight vector and u is a fixed learning constant. After obtaining a new weight vector, the previous weights w$_1$, w$_2$, ..., w$_M$ of the blind equalizer 100 are replaced. The weights w$_1$, w$_2$, ..., w$_M$ of the blind equalizer 100 are continuously changed until signals received by the receiver are optimized.

Here, $$W(n+1) = \begin{bmatrix} w_1(n+1) \\ w_2(n+1) \\ \vdots \\ w_M(n+1) \end{bmatrix}$$

is a weight vector after the previous weight vector of the equalizer has gone through a unit time interval, $$W(n) = \begin{bmatrix} w_1(n) \\ w_2(n) \\ \vdots \\ w_M(n) \end{bmatrix}$$

is the previous weight vector of the equalizer, $$X(n) = \begin{bmatrix} x_1(n) \\ x_2(n) \\ \vdots \\ x_M(n) \end{bmatrix}$$

is a data vector, u is a fixed learning constant, and e(n) is an error signal.

Figure 5:
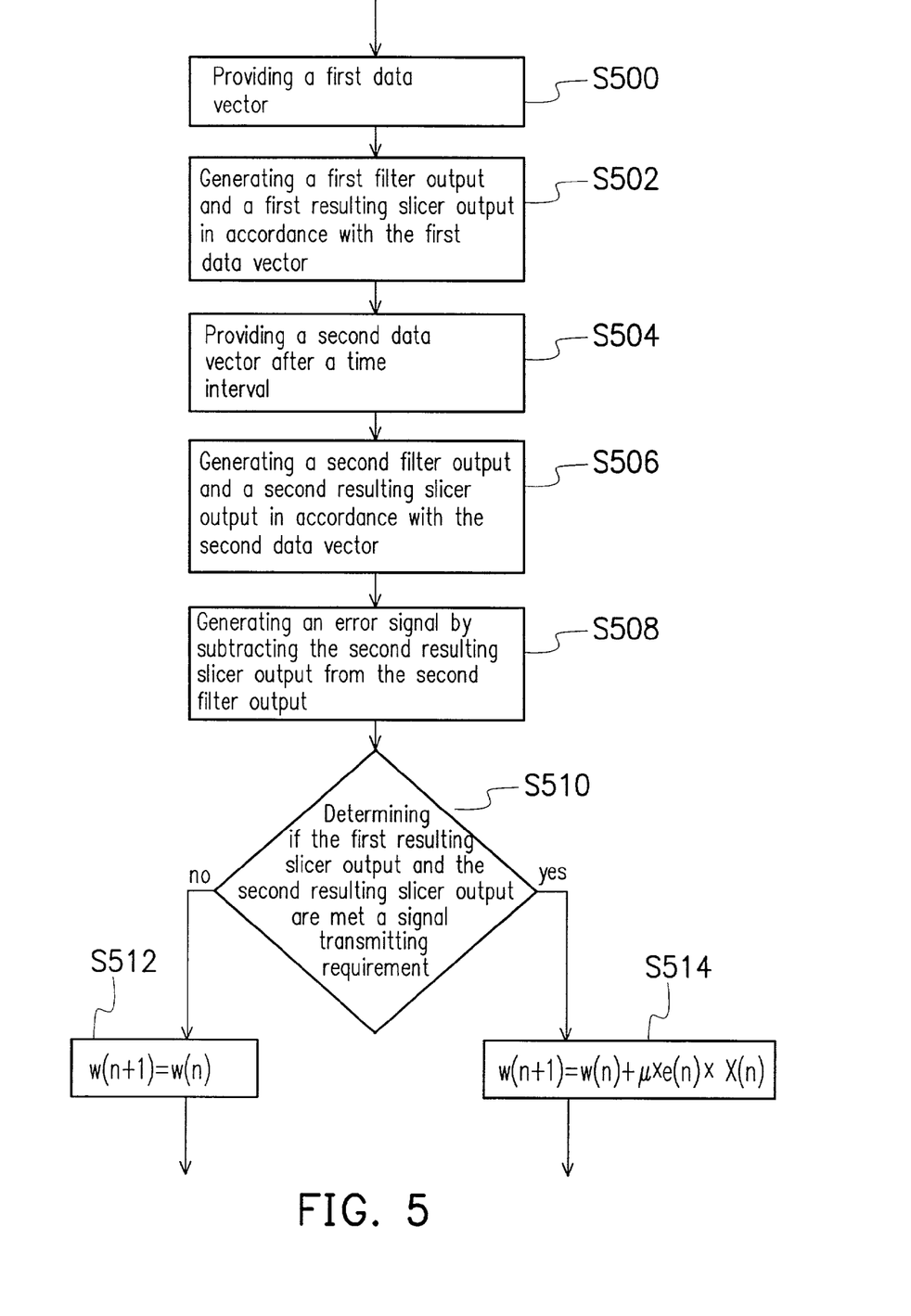
FIG. 5 is a flow diagram showing a second method of adjusting the weights of a blind equalizer according to one preferred embodiment of this invention.

FIG. 5 is a flow diagram showing a second method of adjusting weights of an equalizer according to another preferred embodiment of this invention. Hereinafter, description of FIG. 5 is accompanying with FIG. 1. First, as in step S500, a first data vector is fed into the equalizer 100. Second, a first filter output and a first resulting slicer output are generated according to the first data vector. In the embodiment, the filter output and the first resulting slicer output can be generated simultaneously without any delay. For example, if the weight vector (w$_1$=0.6, w$_2$=0.4, w$_3$=0.7, w$_4$=0.8) and the first data vector (1.1, 1.1, 0.9, 0) are obtained, an inner product operation is performed to generate the first filter output (0.66+0.44+0.63+0=1.73). The first filter output is then fed into the slicer 102. If slice levels of the slicer 102 such as a triple-layer slicer are +1.8, 0, and −1.8, the corresponding resulting slicer output is 3.6, 0, and −3.6 (for R$_1$=3.6 and R$_2$=1.8). The first resulting slicer output is equal to zero (logic zero) after comparing the first filter output which is equal to 1.73 with the slice levels of the slicer 102.

In step S504, a second data vector is sequentially fed into the equalizer 100 after a unit time interval when the first data vector is fed into the equalizer 100. Then a second filter output and a second resulting slicer output are generated in accordance with the second data vector. As stated in step S506, a second resulting slicer output is generated by the second data vector in accordance with the second filter output. For example, if the second filter output =1.9, a second resulting slicer output is equal to 3.6 (logic one) after comparing the second filtered output with the slice levels of the slicer 102.

Then, as stated in step S508, an error signal e(n)=3.6−1.9=1.7 by subtracting the second filter output from the second resulting slicer output.

Then, as stated in step S510, determining if the first resulting slicer output and the second resulting slicer output are met a signal transmitting requirement. If it is against the signal transmitting requirement, an error signal e(n) in the least-mean-square method W(n+1)=W(n)+u×e(n)×X(n) is equal to zero, that is, e(n)=0 and $\overline{W}$(n+1)=$\overline{W}$(n), as stated in step S512. Otherwise, if it is not against the requirements, the least-mean-square method $\overline{W}$(n+1)=$\overline{W}$(n)+u×e(n)×X(n) is executed, as stated in step S514. The signal transmitting requirement is a protocol requirement for signal transmission as known in the art. For example, for a MLT-3 signaling, which involves a three voltage level system. Alternatively, in other embodiments of different communication protocols, signal transmitting requirements are different from each other, which depends on the desired design. There different cases are all belonging to the scope of the invention.

For example, in this embodiment, if a three-layer slicer is provided, the three layers are a logic positive one level, a logic zoro level and a logic negative one level, respectively, as stated above as the MLT-3 signaling. According to the original signal transmitting requirement, only one logic level can be endured for two continuous resulting slicer outputs. For example, it is illegal for the resulting slicer outputs being changed from the logic positive one level to the logic negative one level, or from the logic negative one level to the logic positive one level. In such MLT-3 signaling, four states such as 0, 1, 0 and −1 are kept on recurring. If a state "1" is willing to transmit, a present state will be changed to a new state. If a "0" is willing to transmit, the present state will be maintained without change. For example, if a data "0 0 0 1 0 1 1 1 0" is willing to transmit, MLT3 signaling will decode the data as "(0) 0 0 0 1 1 0 −1 0 0", including an initial state (0). However, if the first resulting slicer output is logic positive one level and the second resulting slicer output is logic negative one level, two logic levels are found in the continuous first and second resulting slicer outputs. It means that these two continuous resulting slicer outputs are against the signal transmitting requirement. The three-layer slicer is described herein for a preferred embodiment of the invention. However, people skilled in the art all know that multiple layers are suitable for the invention. If multiple logic levels are determined and a number of the logic levels are well established for determining being against or not the requirement of signals, the result of being against or not the signal transmitting requirement is then determined, as embodied in the invention. The signal transmitting requirement is also alterative according to different communication systems, as desired.

Figure 6:
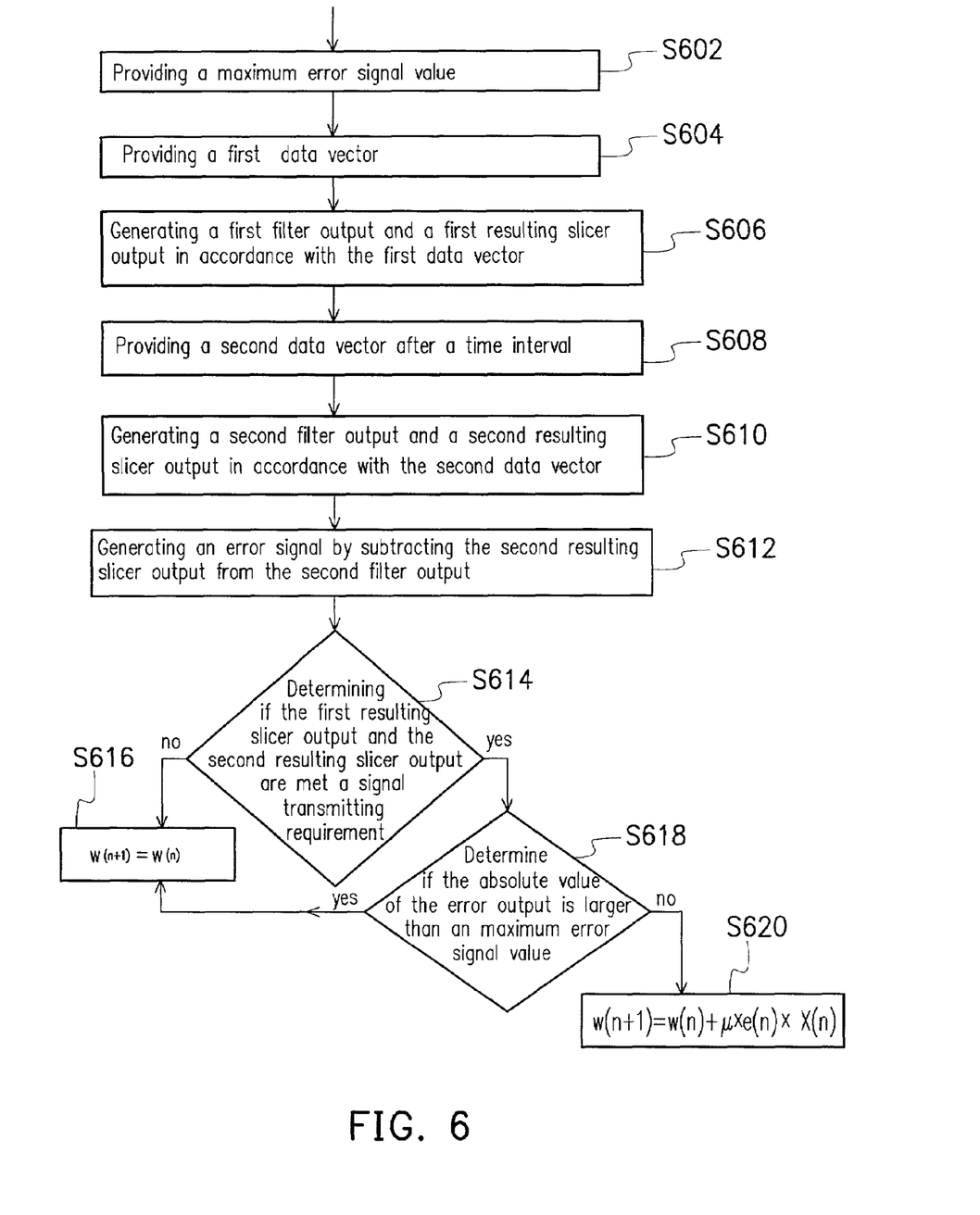
FIG. 6 is a flow diagram showing a third method of adjusting the weights of a blind equalizer according to one preferred embodiment of this invention.

Refer to FIG. 6, which is a flow diagram showing a third method of adjusting weights of a blind equalizer according to one preferred embodiment of this invention. First, as in step S602, a maximum error signal value is provided. In step S604, a first data vector is fed into the equalizer. A first filter output and a first resulting slicer output are generated according to the first data vector, as stated in step S606. Then, in step S608, a second data vector is fed into the equalizer after a unit time interval when the first data vector is fed into the equalizer. Then a second filter output and a second resulting slicer output are generated in accordance with the second data vector, as stated in step S610. The second resulting slicer output is generated by the second data vector in accordance with the second filter output. In step S612, an error signal is produced by subtracting a second filter output from a resulting slicer output.

In the following step S614, it is determined if the first resulting slicer output and the second resulting slicer output are met the signal transmitting requirement. If it is against the signal transmitting requirement, an error signal e(n) in the least-mean-square method W(n+1)=W(n)+u×e(n)×X(n) is equal to zero, that is, e(n)=0 and $\overline{W}$(n+1)=$\overline{W}$(n), as stated in step S616. Otherwise, if it is not against the signal transmitting requirement, then step S618 is followed. In step S618, it is determined whether the absolute value of the error signal e(n) is larger than a maximum error signal value. If yes, then the error signal e(n) in the least-mean-square method W(n+1)=W(n)+u×e(n)×X(n) is equal to zero, that is, e(n)=0 and W(n+1)=W(n), as stated in step S616. If not, the least-mean-square method W(n+1)=W(n)+u×e(n)×X(n) is executed, as stated in step S620.

In the embodiments of this invention, several applications of adjusting weights of an equalizer are introduced to optimize an error signal of the equalizer. By a least-mean-square method, the weights of the equalizer are adjusted in accordance with the error signal. If the error signal is larger than a predetermined value, such as the maximum error signal value, it means that there are some problems in the signal transmitting. The error signal will be omitted and the weights of the equalizer will not be adjusted. If the weights of the equalizer are adjusted without taking such problems into consideration, it will cause adjusted weights inaccurate.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of adjusting weights of a blind equalizer, the equalizer having a weight vector, the method comprising of:
   feeding a data vector into the equalizer;
   generating a filter output in response to the data vector and the weight vector, the filter output being fed into a slicer;
   generating a resulting slicer output in accordance with the filter output and slice levels of the slicer;
   providing a maximum error signal value;
   generating an error signal by subtracting the filter output from the resulting slicer output; and
   if the absolute value of the error signal is larger than the maximum error signal value,
   setting W(n+1)=W(n),
   if the absolute value of the error signal is not larger than the maximum error signal value, setting W(n+1)=W(n)+u×e(n)×X(n), wherein
   W(n) is a previous weight vector of the equalizer;
   W(n+1) is a resulting weight vector after the previous weight vector of the equalizer has gone through a unit time interval;
   u is a fixed learning constant;
   e(n) is the error signal; and
   X(n) is the data vector.

2. A method of adjusting weights of a blind equalizer, the equalizer having a data vector, the method comprising of:
   feeding a first data vector into the equalizer;
   generating a first filter output in response to the first data vector and a pervious weight vector, the first filter output being fed into a slicer;

generating a first resulting slicer output in accordance with the first filter output and slice levels of the slicer;
feeding a second data vector into the equalizer after a unit time interval when the first data vector is fed into the equalizer;
generating a second filter output in response to the second data vector and the previous weight vector, the second filter output being fed into the slicer
generating a second resulting slicer output in accordance with the second filter output and the slice levels of the slicer;
generating an error signal by subtracting the second filter output from the second resulting slicer output; and
determining if the first resulting slicer output and the second resulting slicer output are not met a signal transmitting requirement,
setting $W(n+1)=W(n)$,
if the first resulting slicer output and the second resulting slicer output are met the signal transmitting requirement
setting $W(n+1)=W(n)+u \times e(n) \times X(n)$, wherein
W(n) is the previous weight vector of the equalizer;
W(n+1) is a resulting weight vector after the previous weight vector of the equalizer has gone through a unit time interval;
u is a fixed learning constant;
e(n) is the error signal; and
X(n) is the second data vector.

3. A method of adjusting weights of a blind equalizer, the equalizer having a first weight vector, the method comprising of:
providing a maximum error signal value;
feeding a first data vector into the equalizer;
generating a first filter output in response to the first data vector and the first weight vector, the first filter output being fed into a slicer;
generating a first resulting slicer output in accordance with the first filter output and slice levels of the slicer;
feeding a second data vector into the equalizer after a unit time interval when the first data vector is fed into the equalizer;
generating a second filter output in response to the second data vector and the first weight vector, the second filter output being fed into the slicer;
generating an error signal by subtracting the second filter output from a second resulting slicer output;
if the first resulting slicer output and the second resulting slicer output are not met a signal transmitting requirement,
setting $W(n+1)=W(n)$,
if the first resulting slicer output and the second resulting slicer output are met the signal transmitting requirement,
determining if the absolute value of the error signal e(n) is larger than a maximum error signal value,
if yes, setting $W(n+1)=W(n)$,
if no, setting $W(n+1)=W(n)+u \times e(n) \times X(n)$, wherein
W(n) is the first weight vector of the equalizer;
W(n+1) is a second weight vector after the first weight vector of the equalizer has gone through a unit time interval;
u is a fixed learning constant;
e(n) is the error signal; and
X(n) is the data vector.

\* \* \* \* \*